(12) United States Patent
Hirose et al.

(10) Patent No.: US 7,679,076 B2
(45) Date of Patent: Mar. 16, 2010

(54) OPTICAL SEMICONDUCTOR DEVICE AND METHOD OF MANUFACTURING THE SAME

(75) Inventors: Shinichi Hirose, Kawasaki (JP); Tatsuya Usuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 93 days.

(21) Appl. No.: 11/896,154

(22) Filed: Aug. 30, 2007

(65) Prior Publication Data

US 2007/0295977 A1 Dec. 27, 2007

Related U.S. Application Data

(63) Continuation of application No. PCT/JP2005/003798, filed on Mar. 4, 2005.

(51) Int. Cl.
*H01L 29/06* (2006.01)
(52) U.S. Cl. ............ 257/9; 257/26; 257/E29.071; 977/774; 977/932; 438/962
(58) Field of Classification Search ............ 257/9, 257/26, E29.071; 977/774, 932; 438/962
See application file for complete search history.

(56) References Cited

U.S. PATENT DOCUMENTS

| 5,422,901 | A | * | 6/1995 | Lebby et al. ............ 372/36 |
| 6,156,582 | A | | 12/2000 | Shieh et al. ............ 438/29 |
| 2002/0160520 | A1 | * | 10/2002 | Orloff et al. ............ 436/72 |

| 2003/0218143 | A1 | * | 11/2003 | Shields et al. ............ 250/493.1 |
| 2004/0038440 | A1 | | 2/2004 | Hatori ............ 438/47 |
| 2004/0120379 | A1 | | 6/2004 | Kaneko et al. ............ 372/50 |

(Continued)

FOREIGN PATENT DOCUMENTS

JP 01-161878 6/1989

(Continued)

OTHER PUBLICATIONS

Zhiliang Yuan et al.: "Electrically Driven Single-Photon Source", Jan. 4, 2002, vol. 295, http://www.sciencemag.org (4 pages).

*Primary Examiner*—Evan Pert
*Assistant Examiner*—Scott R Wilson
(74) *Attorney, Agent, or Firm*—Fujitsu Patent Center

(57) ABSTRACT

Provided is an optical semiconductor device, which includes a GaAs substrate (or a semiconductor substrate) 20; an n-type contact layer (or a doping layer) 21 formed on one surface 20a of the GaAs substrate 20; an active layer 25 formed on top of the n-type contact layer 21 and including at least one quantum dot 23; a p-type contact layer (or a contact layer) 26 formed on top of the active layer 25 and being of an opposite conduction type to the n-type contact layer 21; an insulating layer 29 formed on top of the p-type contact layer 26 and including a first opening 29a whose size is such that a contact region CR of the p-type contact layer 26 lies within the first opening 29a; a p-side electrode layer 33c formed on top of the contact region CR of the p-type contact layer 26 and on top of the insulating layer 29 and including a second opening 33a lying within the first opening 29a; and a n-side electrode layer (or a second electrode layer) 37 formed on the other surface 20b of the GaAs substrate 20.

20 Claims, 13 Drawing Sheets

U.S. PATENT DOCUMENTS

2004/0197070 A1 10/2004 Takemoto et al. ............ 385/147
2006/0281202 A1* 12/2006 Ishida et al. .................. 438/21

FOREIGN PATENT DOCUMENTS

| JP | 03-177089 | * | 8/1991 |
| JP | 04-061176 | | 2/1992 |
| JP | 07-183615 | | 7/1995 |
| JP | 08-162713 | | 6/1996 |
| JP | 2003-101149 | | 4/2003 |
| JP | 2004-87615 | | 3/2004 |
| JP | 2004-119581 | | 4/2004 |
| JP | 2004-253657 | | 9/2004 |
| JP | 2004-319643 | | 11/2004 |
| WO | 2006/095393 | | 9/2006 |

* cited by examiner (a)

(b)

OPTICAL SEMICONDUCTOR DEVICE AND METHOD OF MANUFACTURING THE SAME

CROSS-REFERENCE TO RELATED APPLICATIONS

This application is a continuation of prior International Patent Application No. PCT/JP2005/003798, filed Mar. 4, 2005, the entire contents of which are incorporated herein by reference.

TECHNICAL FIELD

The present invention relates to an optical semiconductor device and a method of manufacturing the same.

BACKGROUND ART

Internet technology is now in widespread use in society, and the early establishment of quantum cryptography communications is desired in order to provide security for electronic commerce or the like on the Internet. The quantum cryptography communications are carried out by bringing one bit of information into correspondence with the polarized state of a photon. When an outsider on a communication channel wiretaps the information, the polarized state of the photon is destroyed and thus the occurrence of wiretapping is detected immediately.

Implementation of quantum cryptographic technology requires an optical semiconductor device such as a single-photon generator for generating a single photon that serves as an information carrier. Some types of single-photon generators until now have been reported, and a device of such a structure shown in FIG. 1 has been proposed in Non-patent Document 1 given below.

FIG. 1 is a cross-sectional view of a conventional single-photon generator.

In the single-photon generator, a p-type contact layer 2 made of p-type GaAs is formed on a GaAs substrate 1 with a buffer layer (not shown) therebetween. A bottom barrier layer 3 made of GaAs, a quantum dot 4 made of InAs, and a top barrier layer 5 made of GaAs are formed in this order on the p-type contact layer 2. Further, an n-type contact layer 6 made of n-type GaAs is forced on the top barrier layer 5, and a n-side electrode layer 7 is formed on the n-type contact layer 6 with ohmic contact.

The layers 3 to 6 are patterned into a mesa shape in cross section. A lead electrode 9 is formed on the side surface of the mesa with an insulating layer 8 therebetween, and the current is supplied to the n-side electrode layer 7 via the lead electrode 9. On the other hand, a p-side electrode layer 10 is formed on the p-type contact layer 2 beside the mesa, and the p-side electrode layer 10 is in ohmic contact with the p-type contact layer 2.

In this single-photon generator, a single photon created by recombination of carriers is generated in the quantum dot 4 by passing the current between the n-side electrode layer 7 and the p-side electrode layer 10, and the single photon 11 thus generated is taken out of the device through a window 7a of the n-type electrode layer 7.

FIG. 2 is a plan view of this single-photon generator. FIG. 1 corresponds to a cross-sectional view taken along the line I-I of FIG. 2.

As shown in FIG. 2, the planar shape of the n-type contact layer 6 is square, and the length of its side D is about 10 μm. A region where the n-type contact layer 6 is in contact with the n-side electrode layer 7 functions as a contact region $CR_0$ through which a current is injected into the quantum dot 4 (see FIG. 1). In an example shown in FIG. 2, the n-side electrode layer 7 covers nearly the entire area of the n-type contact layer 6, and therefore the contact region $CR_0$ has a square shape whose side is 10 μm, which is substantially the same as a region where the n-type contact layer 6 is formed.

Incidentally, if the contact region $CR_0$ shown in FIG. 2 has a large area, power consumption increases due to the excessive current injection into the quantum dot 4 (see FIG. 1). The excessive current leads to the generation of heat in the quantum dot 4, which in turn causes the shift of the wavelength of the single photon than designed value. Moreover, the large area of the contact region $CR_0$ leads to large parasitic capacitance between the n-side electrode layer 7 and the GaAs substrate 1. Therefore, when the frequency of a signal voltage to the electrode layers 7 and 10 is increased, signal delay caused by the parasitic capacitance increases. It is therefore desirable that the contact region $CR_0$ have as small an area as possible.

Incidentally, examples of technologies related to the present invention are also disclosed in Patent Documents 1 and 2 given below.

Non-patent Document 1: Zhiliang Yuan et al., Science 295, 102 (2002)

Patent Document 2: Japanese Unexamined Patent Application Laid-open Publication No. 2004-253657

Patent Document 3: Japanese Unexamined Patent Application Laid-open Publication No. Hei 4-61176

DISCLOSURE OF THE INVENTION

An object of the present invention is to provide an optical semiconductor device and a method of manufacturing the same capable of achieving low power consumption during current injection and also being fabricated by an easy manufacturing process adapted for mass production.

According to one aspect of the present invention, there is provided an optical semiconductor device including: a semiconductor substrate; a doping layer formed on one surface of the semiconductor substrate; an active layer formed on the doping layer and including at least a quantum dot; a contact layer formed on the active layer and being of an opposite conduction type to the doping layer; an insulating layer formed on the contact layer and having a first opening whose size is such that a contact region of the contact layer is included in the first opening; a first electrode layer formed on the contact region of the contact layer and on the insulating layer, and having a second opening included in the first opening; an optical window formed on the contact layer in the second opening; and a second electrode layer formed on the other surface of the semiconductor substrate.

According to another aspect of the present invention, there is provided a method of manufacturing an optical semiconductor device including the steps of: forming a doping layer, an active layer including at least a quantum dot, and a contact layer of an opposite conduction type to the doping layer on one surface of a semiconductor substrate in this order; forming a mask layer on the contact layer; forming a resist in island shape on the mask layer; making the mask layer into a hard mask for use in an optical window by etching the mask layer using the resist as a mask; receding a side surface of the hard mask to expose a contact region of the contact layer and to make the resist overhang beyond the upper surface of the hard mask; forming an insulating layer on the resist and on the contact layer outside the contact region; forming a conductive layer on the insulating layer and on the contact layer within the contact region; lifting-off the insulating layer and the conductive layer on the resist by removing the resist, so that the insulating film, which has a first opening whose size is such that the contact region is included in the first opening, is left on the doping layer, and the conductive layer, which has a second opening whose size is such that the second opening is included in the first opening, is left on the doping layer as a first electrode layer; and forming a second electrode layer on the other surface of the semiconductor substrate.

BEST MODE FOR CARRYING OUT THE INVENTION

Detailed description will now be given with regard to an embodiment of the present invention with reference to the accompanying drawings.

Figure 8:
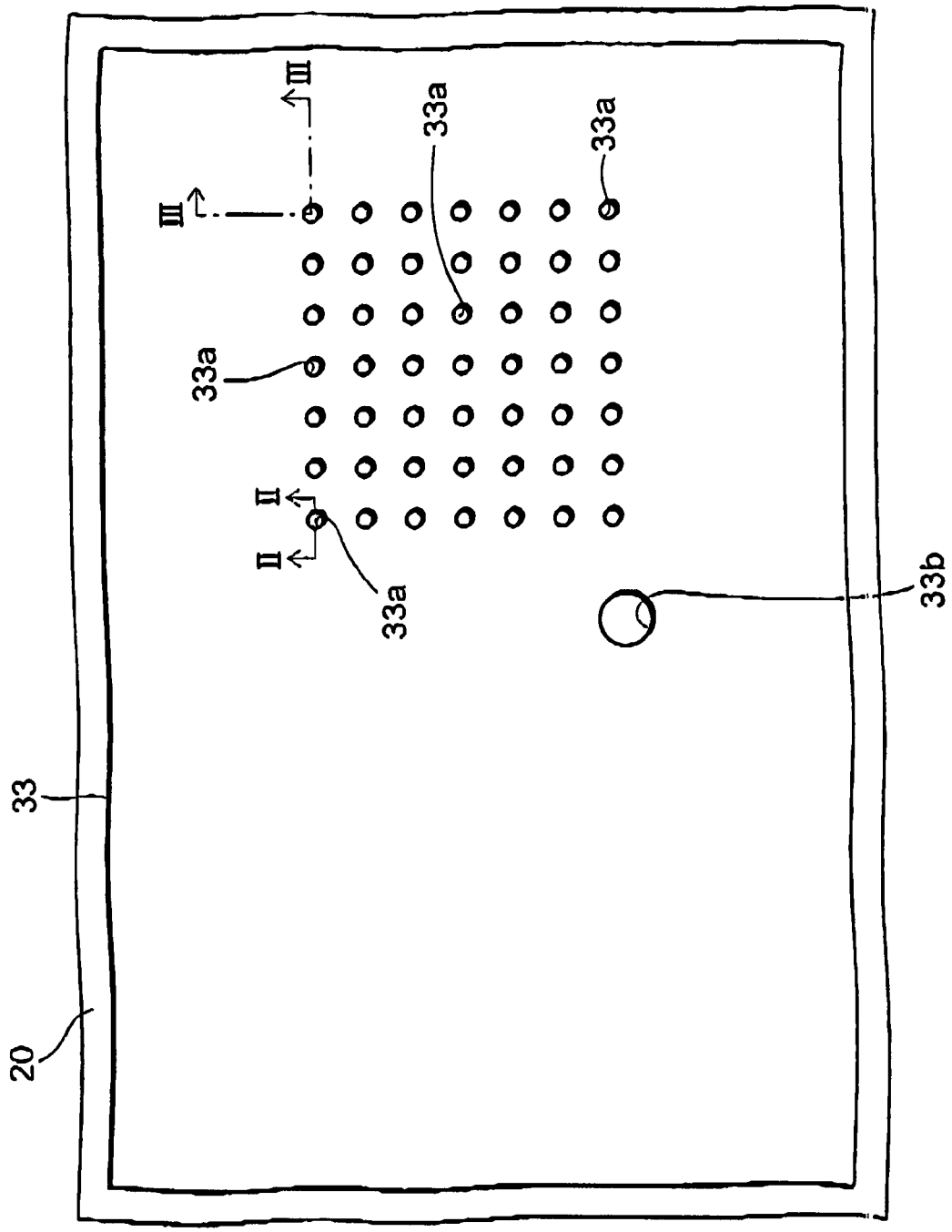
FIG. 8 is a plan view of the optical semiconductor device according to the embodiment of the present invention as being in process of manufacture (Part 1).
Figure 9:
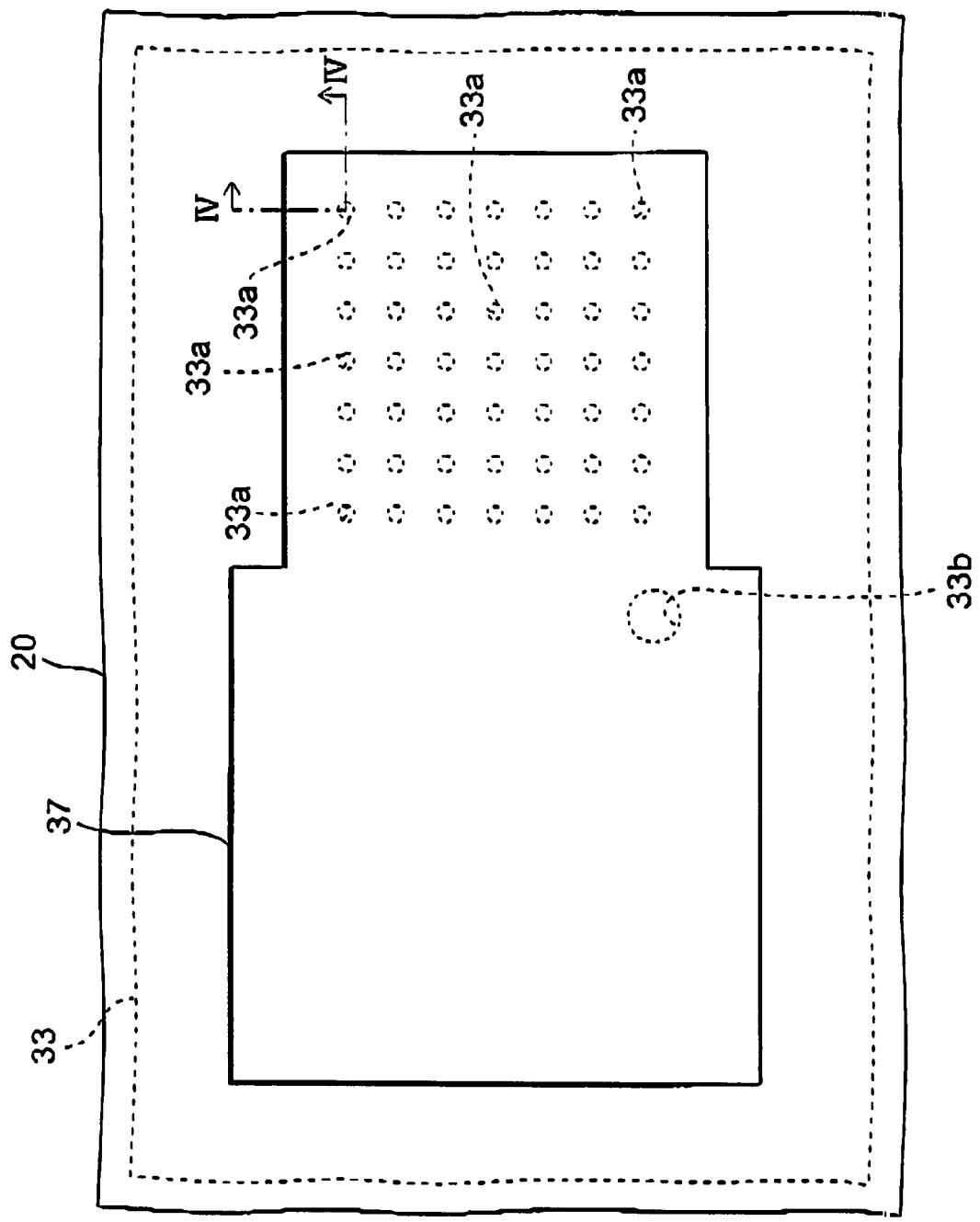
FIG. 9 is a plan view of the optical semiconductor device according to the embodiment of the present invention as being in process of manufacture (Part 2).
Figure 10:
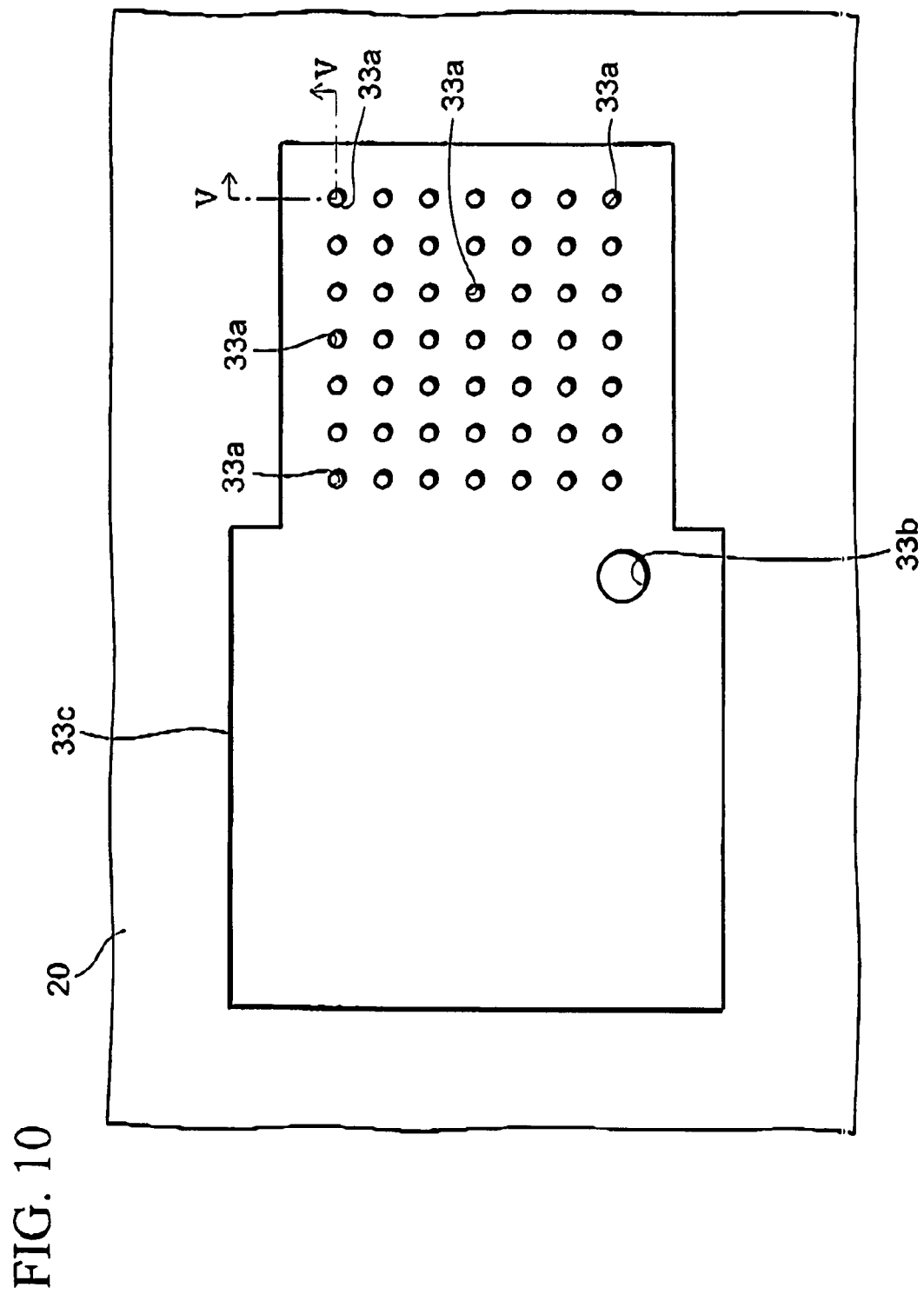
FIG. 10 is a plan view of the optical semiconductor device according to the embodiment of the present invention as being in process of manufacture (Part 3).

FIGS. 3 to 7 are cross-sectional views of an optical semiconductor device according to the embodiment of the present invention in process of manufacture. FIGS. 8 to 10 are plan views of the optical semiconductor device according to the embodiment of the present invention in process of manufacture.

In the embodiment, a single-photon generator suitable for quantum cryptographic technology is fabricated as the optical semiconductor device.

Firstly, description will be given with regard to a process leading to a cross-sectional configuration shown in FIG. 3(a).

First, an n-type GaAs substrate (semiconductor substrate) 20 is placed in a reactor (not shown). Then, a mixed gas of trimethyl aluminum (TMA), triethyl gallium (TEG), arsine ($AsH_3$), and silane ($SiH_4$) is supplied into the reactor, and an n-type AlGaAs layer doped with silicon as an n-type impurity is formed on one surface 20a of the GaAs substrate 20 by a MOCVD (metal organic chemical vapor deposition) method. The n-type AlGaAs layer thus formed is used as an n-type contact layer (doping layer) 21.

Then, the supply of the gases is stopped, and a mixed gas of triethyl gallium and arsine is supplied into the reactor instead. Thus, the growth of a GaAs layer by MOCVD method is started, and the GaAs layer is used as a bottom barrier layer 22.

Thereafter, trimethyl indium and arsine are supplied into the reactor, and thereby an InAs wetting layer having a thickness of 1 to 1.5 ML (monolayer) is formed on the GaAs bottom barrier layer 22, and then an InAs quantum dot 23 is formed on the InAs wetting layer so as to relieve strain caused by a difference in lattice constant between InAs and GaAs. The thickness of the quantum dot 23 is typically about 2 ML.

Then, a mixed gas of triethyl gallium and arsine is supplied into the reactor, and thereby a GaAs layer is formed as a top barrier layer 24 on the quantum dot 23.

Through the above process, an active layer 25 having a stacked structure formed of, in this order, the bottom barrier layer 22, the quantum dot 23, and the top barrier layer 24 is formed on the n-type contact layer 21. In the active layer 25, the band gap of each of the barrier layers 22 and 24 is larger than that of the quantum dot 23, and thus carriers within the quantum dot 23 are prevented from leaking out by the barrier layers 22 and 24, so that the carriers are trapped in the quantum dot 23.

Thereafter, a mixed gas of trimethyl aluminum, triethyl gallium, arsine, and diethylzinc (DEZn) is supplied into the reactor of the above-mentioned MOCVD apparatus, and a p-type AlGaAs layer doped with zinc as a p-type impurity is formed. The p-type AlGaAs layer is used as a p-type contact layer 26.

Then, as shown in FIG. 3(b), a silicon oxide ($SiO_2$) layer is formed in a thickness of about 450 nm on the p-type contact layer 26 by a low pressure CVD method using monosilane and oxygen as reactant gas, and the silicon oxide layer thus formed is used as a mask layer 27.

After that, a photoresist is coated on the mask layer 27 in a thickness of about 2000 nm, and the photoresist is exposed by an optical exposure system such as a stepper, and thereafter the photoresist is developed to form a resist 28 in island shape. The planar shape of the resist 28 is not particularly limited. In the present embodiment, the resist 28 has a circular planar shape having a diameter $D_0$ of about 1200 nm. An EB exposure system is not required for formation of the resist 28 in a relatively large circular form as in the present case, and therefore the optical exposure system having good throughput as compared to the EB exposure system can be used to form the resist 28.

Description will be given with regard to a process leading to a cross-sectional configuration shown in FIG. 4(a).

First, the mask layer 27 is etched partially in thickness, for example about 300 nm, while using the resist 28 as a mask, by means of wet etching using a buffer HF solution as an etchant. Then, the surface of the mask layer 27 is cleaned, and the mask layer 27 is dry-etched, while using the resist 28 as a mask, by employing RIE (reactive ion etching) using $CF_4$ gas as etching gas. Thereby, the rest of the mask layer 27 of about 150 nm thick are dry-etched, and the remaining mask layer 27 underneath the resist 28 forms a hard mask 27a of mesa shape in cross section.

As mentioned above, the mask layer 27 is wet-etched firstly, and then the remaining mask layer 27 is dry-etched. This prevents the side surface of the hard mask 27a from excessively receding by the wet etching, while preventing the resist 28 from deformation under the influence of plasma in a dry etching atmosphere. In the present embodiment, the above approach is adopted to prevent the shape of the hard mask 27a from deviating from its desired shape, since the planar shape of the resist 28 is an important factor in determining the final shape of the hard mask 27a.

However, when deformation in the resist 28 due to the dry etching is not significant, the hard mask 27a may be formed with the use of the dry etching alone without the use of the wet etching.

Then, as shown in FIG. 4(b), the p-type contact layer 26 is etched partially in thickness, for example about 25 nm deep from the surface, while using the hard mask 27a as a mask, by wet etching using a mixed solution of $NH_4OH$, $H_2O_2$, and $H_2O$ as an etchant, so that the thickness of the portion uncovered with the hard mask 27a of the p-type contact layer 26 is reduced. Incidentally, an etching rate for this process can be easily controlled by etching time.

Then, as shown in FIG. 5(a), the hard mask 27a is selectively etched by employing isotropic wet etching using a buffer HF solution, and thereby all its side surface 27b recedes by a uniform distance d, so that a contact region CR of the p-type contact layer 26 is exposed. The receding amount d of the side surface 27b can be precisely controlled by etching time. In the present embodiment, the etching time is set to about 2 minutes. As a result of the etching, the resist 28 overhangs beyond the upper surface of the hard mask 27a.

Then, as shown in FIG. 5(b), a silicon oxide layer is formed with a thickness of about 300 nm on the flat surface of the p-type contact layer 26 by use of an EB vapor deposition apparatus, and the silicon oxide layer thus formed is used as an insulating layer 29. During this vapor deposition, part of vaporized silicon oxide is led beneath the resist 28, and thus an extremely thin film of the insulating layer 29 is formed also on the p-type contact layer 26 in the contact region CR. However, when the contact region CR is covered with the insulating layer 29 in this manner, a p-side electrode layer to be formed later cannot come into contact with the p-type contact layer 26 in the contact region CR.

To deal with this problem, in the next process, as shown in FIG. 6(a), the insulating layer 29 on the contact region CR is etched away by means of wet etching using a buffer HF solution. Since the insulating layer 29 on the contact region CR is initially formed by the vaporized silicon oxide led beneath the resist 28, the insulating layer 29 in the contact region CR is extremely thin. Thus, the wet etching is completed in a short time on the order of a few seconds.

By this etching, the insulating layer 29 recedes from the contact region CR, so that a first opening 29a is formed in the insulating layer 29. The first opening 29a is in a circular shape, whose size is such that the contact region CR is included in the first opening 29a. Since the first opening 29a is formed by removing the extremely thin silicon oxide layer extending beneath the resist 28a, the first opening 29a is formed in self-aligned manner with the resist 28. Thus, the planar shape of the first opening 29a becomes circular shape having a diameter $D_1$ (about 1200 nm), which is about the same as that of the resist 28.

Incidentally, the contact region CR is defined as the region of the p-type contact layer 26 between the first opening 29a of the insulating layer 29 and the hard mask 27a. Since both the hard mask 27a and the first opening 29a are formed in self-aligned manner with the resist 28, the contact region CR is also exposed in self-aligned manner with the resist 28. Thus, the shape of the contact region CR hardly varies around is the hard mask 27a.

Next, description will now be given with regard to a process leading to a cross-sectional configuration shown in FIG. 6(b). First, the GaAs substrate 20 is placed face down on a jig within a planetary EB (Electron Beam) vapor deposition apparatus (not shown). Then, a source of titanium for vapor deposition is placed under the GaAs substrate 20 that is held in a state where the perpendicular direction of the upper surface of the GaAs substrate 20 is tilted from the vertical direction, and vapor deposition of titanium is then started. With this vapor deposition method, the vaporized titanium is lead beneath the resist 28, because the perpendicular direction of the GaAs substrate 20 is tilted from the vertical direction. As a result, a titanium layer 30 is formed not only on the insulating layer 29 but also on the contact region CR of the p-type contact layer 26. Note that the titanium layer 30 is not particularly limited in thickness. In the embodiment, the titanium layer 30 has a thickness of about 150 nm.

Then, a platinum layer 31 is formed in a thickness of about 300 nm on the titanium layer 30 by use of the same planetary EB vapor deposition apparatus as mentioned above, while using a source of platinum for vapor deposition in place of the source of titanium for vapor deposition. For the same reason as that for the titanium layer 30, the platinum layer 31 also extends beneath the resist 28 and forms in the contact region CR of the p-type contact layer 26.

Then, the GaAs substrate 20 is displaced from the planetary vapor deposition apparatus, and thereafter the GaAs substrate 20 is placed in face down state on a jig within a parallel plate vapor deposition apparatus for use in formation of a gold layer. After that, vapor deposition of gold is started so that a gold layer 32 is formed in a thickness of about 100 nm on the platinum layer 31.

The metal layers 30 to 32 formed by the above process constitute a metal multilayer film (conductive layer) 33. The lowermost titanium layer 30 that is the lowermost metal layer of the metal multilayer film 33 is in ohmic contact with the p-type contact layer 26 in the contact region CR. At the time of packaging, the uppermost gold layer 32 of the metal multilayer film 33 is bonded to a bonding wire made of gold. The gold layer 32 serves to improve wettability to the bonding wire and thus increase bonding strength.

The platinum layer 31 under the gold layer 32 functions as a barrier layer that prevents gold atoms of the gold layer 32 from being carried by current and diffused into the p-type contact layer 26. In this example, the platinum layer 31 is in contact with the p-type contact layer 26, but the structure is not necessarily limited this. For example, the receding amount of the insulating layer 29 in the process shown in FIG. 6(a) may be reduced to narrow the width of the contact region CR, and the titanium layer 30 alone may be brought into contact with the narrowed contact region CR.

It is not necessary that the gold layer 32 extends beneath the resist 28 as is the titanium layer 30 and the platinum layer 31, because the gold atoms are likely to diffuse into the p-type contact layer 26 and hence cause deterioration in characteristics of the p-type contact layer 26.

As previously mentioned, the contact region CR of the p-type contact layer 26 is formed in self-aligned manner with the resist 28, so that the exposed area of the contact region CR is uniform around the hard mask 27a. Thus, the contact area of the metal multilayer film 33 contacting the p-type contact layer 26 is uniform throughout the entire area of the contact region CR.

Moreover, the end of the titanium layer 31 extending inwardly into the first opening 29a comes in contact with the hard mask 27a and forms a second opening 33a of the metal multilayer film 33. A single photon generated in the quantum dot 23 is taken out through the second opening 33a. The second opening 33a is in a circular shape whose size is such that the second opening 33a is included in the first opening 29a, and its diameter $D_2$ lies between, for example, 500 nm and 10 μnm, both inclusive.

Thereafter, the insulating layer 29 and the metal layers 30 to 32 on the resist 28 undergo lift-off process by immersing the GaAs substrate 20 in a heated remover fluid while allying ultrasonic to the resist 28. After the lift-off process, the hard mask 27a made of optically transparent silicon oxide is used as an optical window for letting out the single photon, as will be described later.

Figure 7:
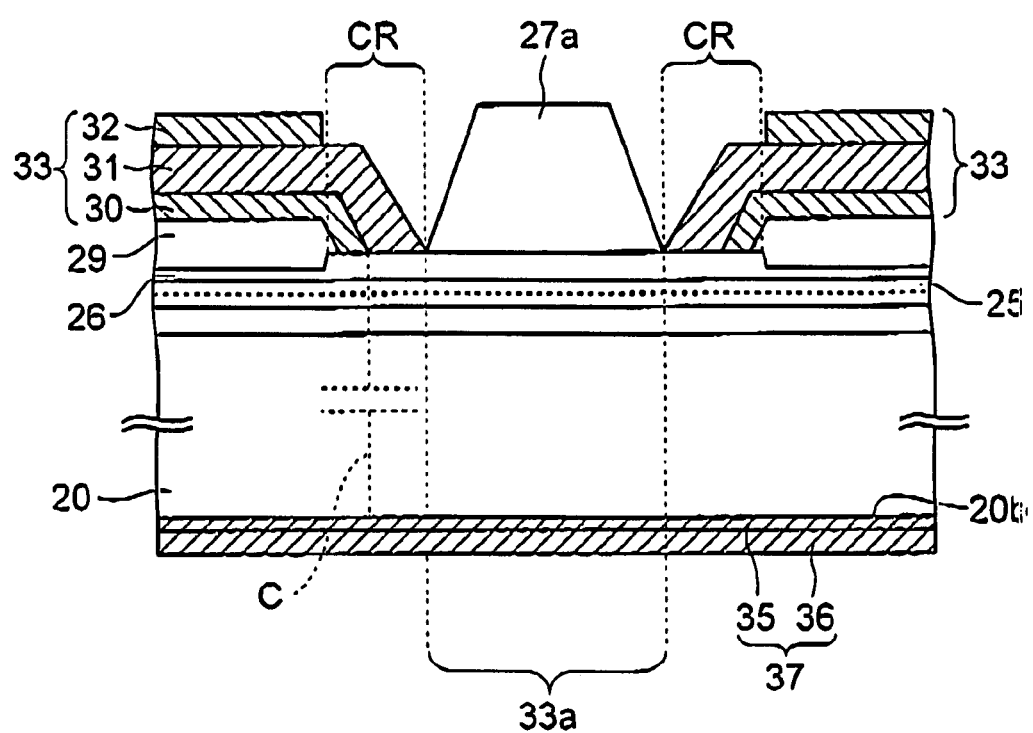
FIG. 7 is a cross-sectional view of the optical semiconductor device according to the embodiment of the present invention as being in process of manufacture (Part 5).

Then, as shown in FIG. 7, a gold-germanium alloy layer 35 of about 100 nm thick and a gold layer 36 of about 300 nm thick are formed in this order on the other surface 20b of the GaAs substrate 20 by use of a resistive heating deposition apparatus, and the layers 35 and 36 are used as an n-side electrode layer (second electrode layer) 37.

FIG. 8 is a plan view after the completion of this process. FIG. 7 corresponds to a cross-sectional view taken along the line II-II of FIG. 8.

Figure 1:
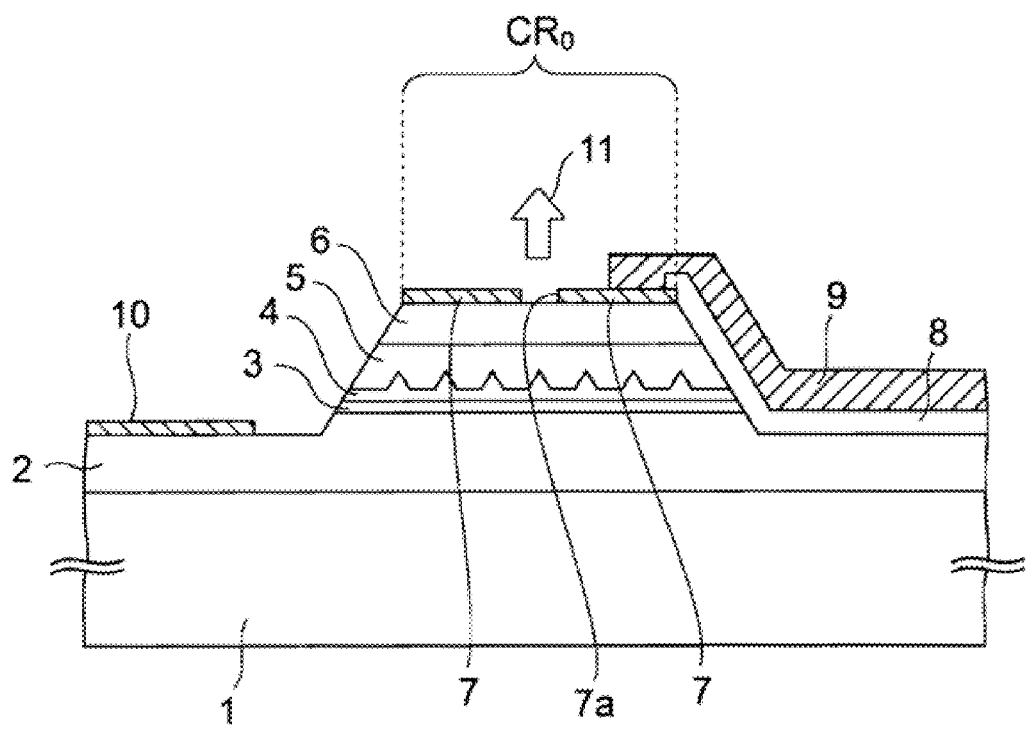
FIG. 1 is a cross-sectional view of a conventional single-photon generator.
Figure 2:
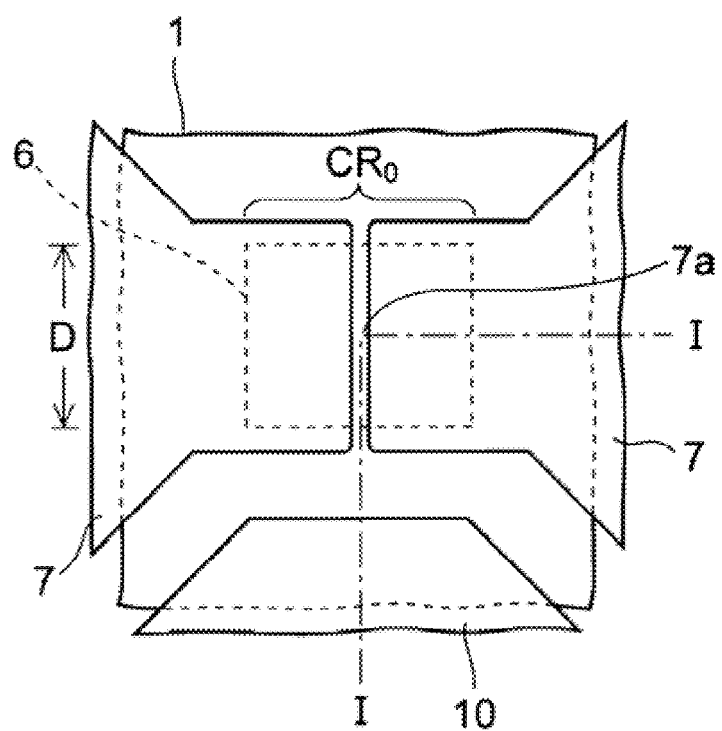
FIG. 2 is a plan view of the conventional single-photon generator.
Figure 3:
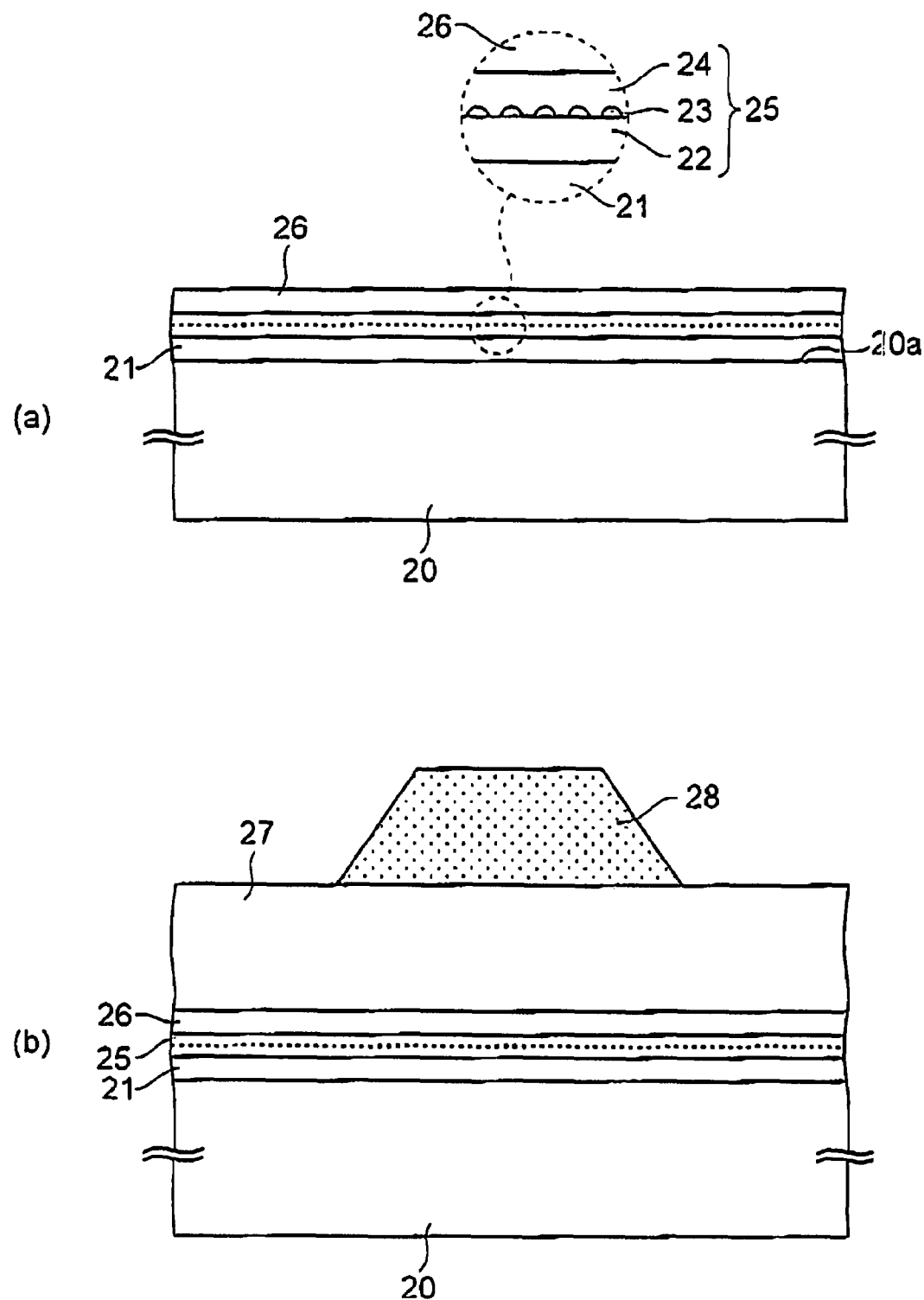
FIGS. 3(a) and 3(b) are cross-sectional views of an optical semiconductor device according to an embodiment of the present invention as being in process of manufacture (Part 1).
Figure 4:
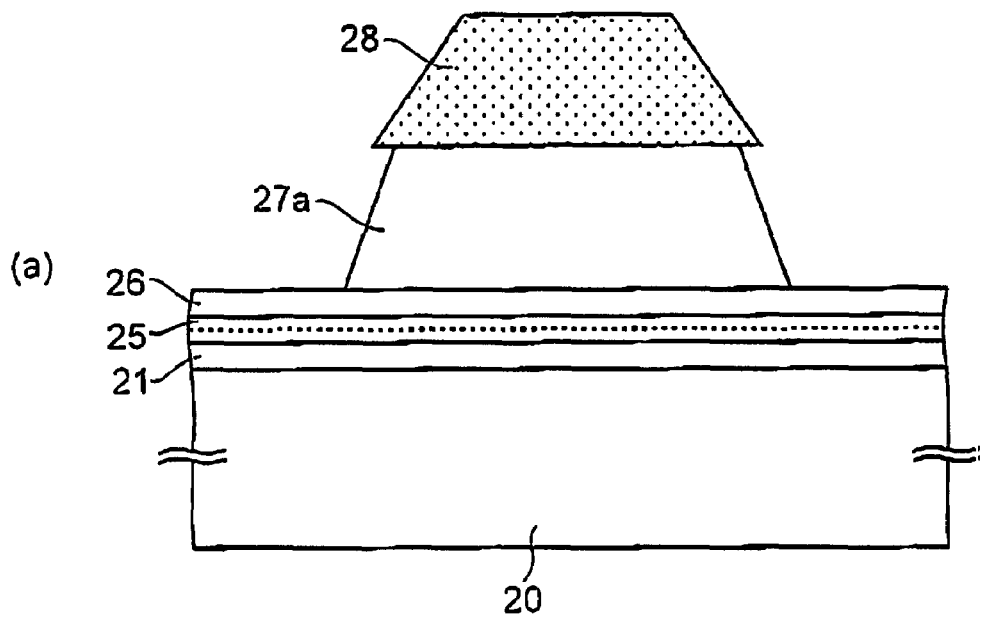
FIGS. 4(a) and 4(b) are cross-sectional views of the optical semiconductor device according to the embodiment of the present invention as being in process of manufacture (Part 2).
Figure 4:
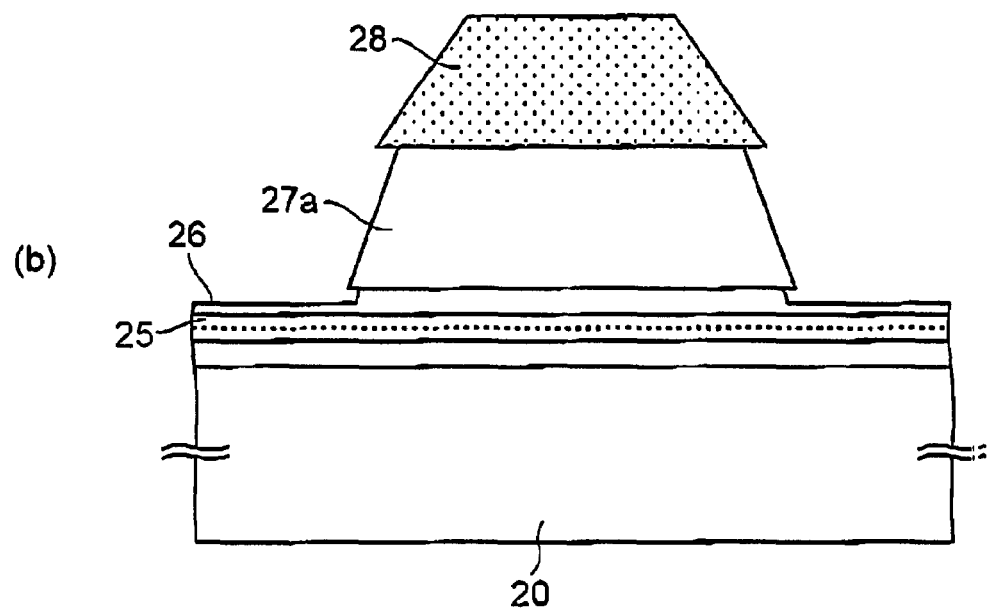
Figure 5:
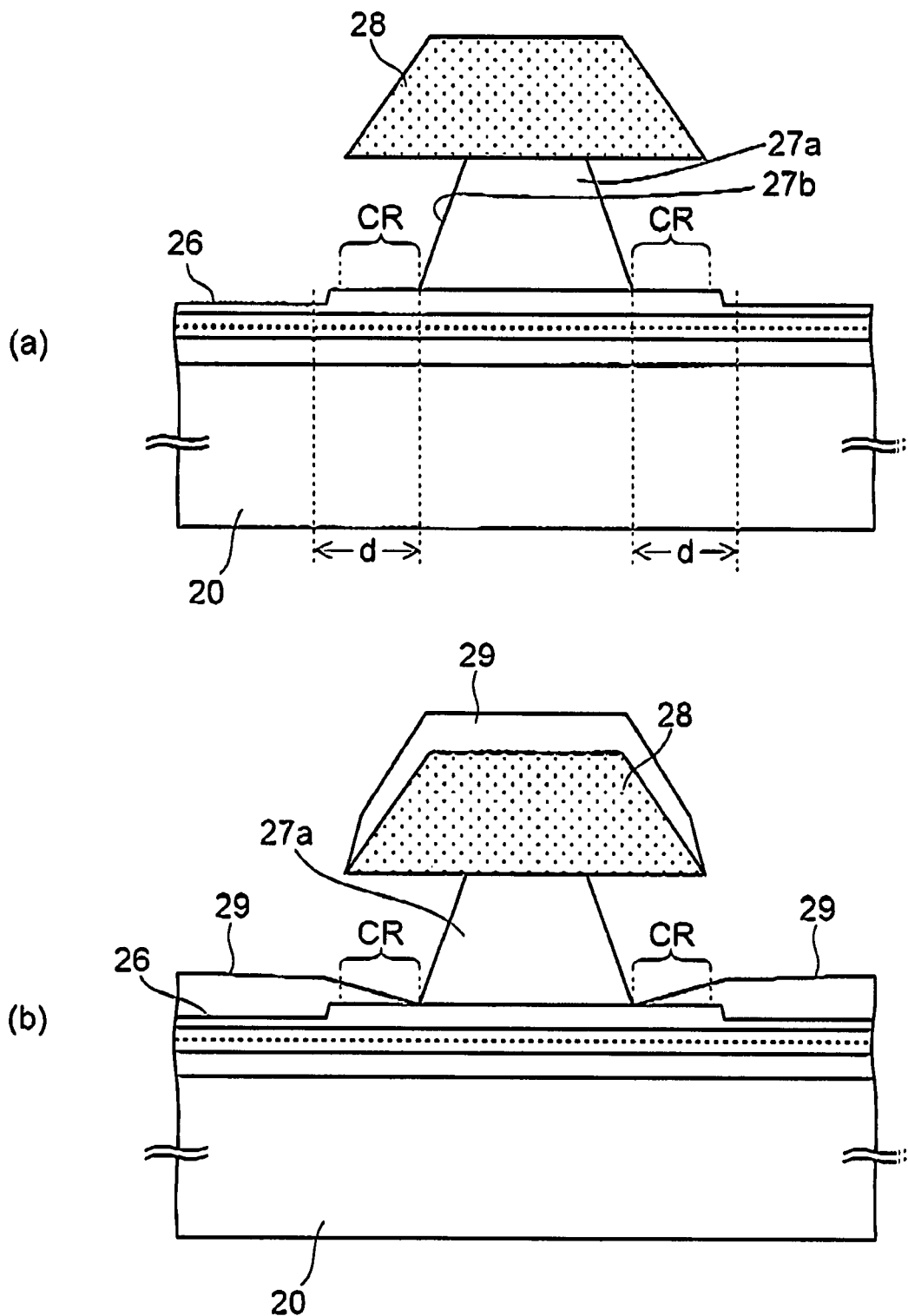
FIGS. 5(a) and 5(b) are cross-sectional views of the optical semiconductor device according to the embodiment of the present invention as being in process of manufacture (Part 3).
Figure 6:
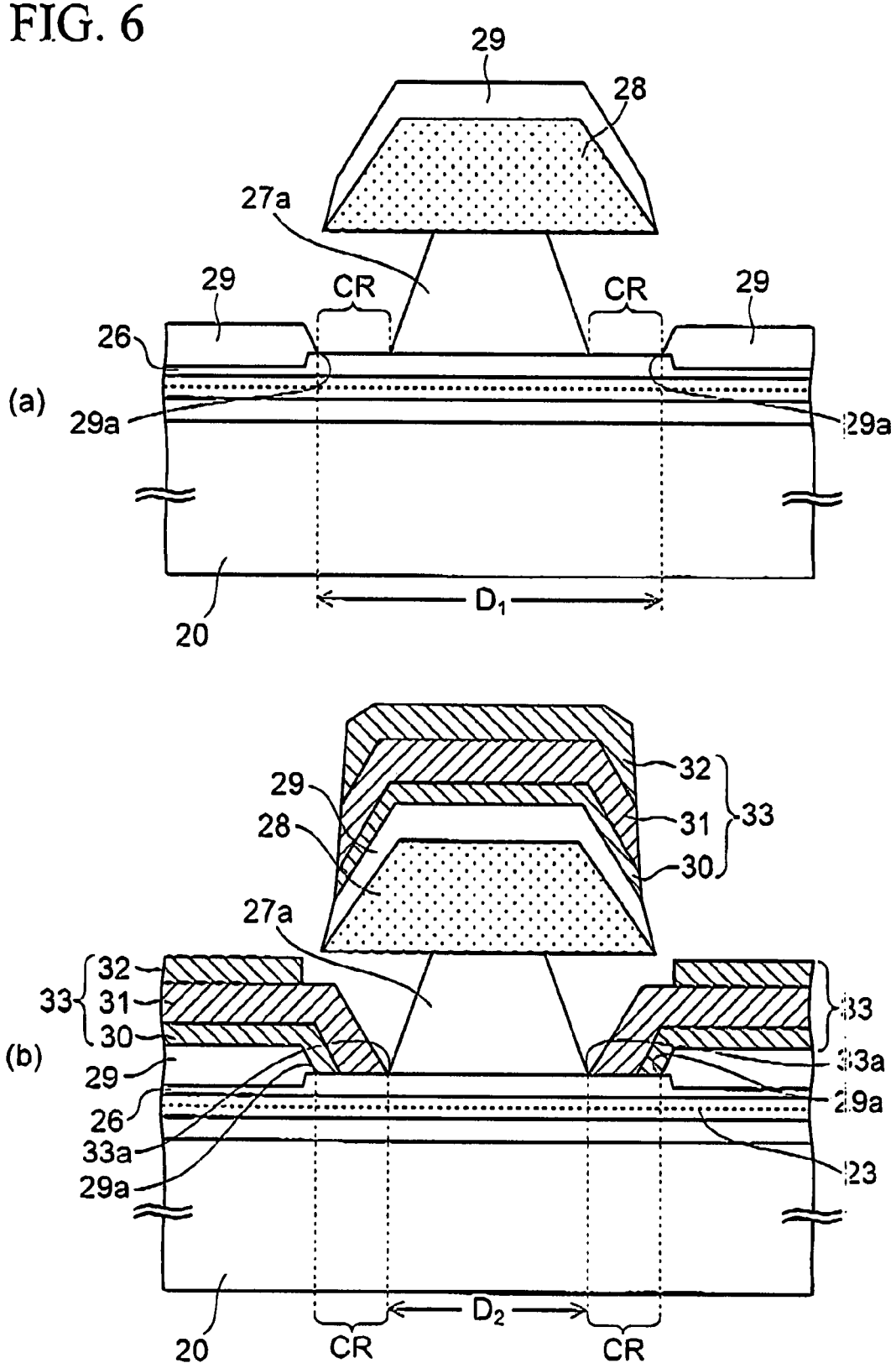
FIGS. 6(a) and 6(b) are cross-sectional views of the optical semiconductor device according to the embodiment of the present invention as being in process of manufacture (Part 4).

In the present embodiment, as shown in FIG. 3, the metal multilayer film 33 is provided with a matrix of plural second openings 33a that are formed at a distance from each other. The metal multilayer film 33 is further provided with a test opening 33b, which is spaced away from the second openings 33a, by the same process as that for the second openings 33a. The test opening 33b has a larger diameter than the second openings 33a and is used for tests to determine optical output characteristics and the like of the finished optical semiconductor device.

Figure 11:
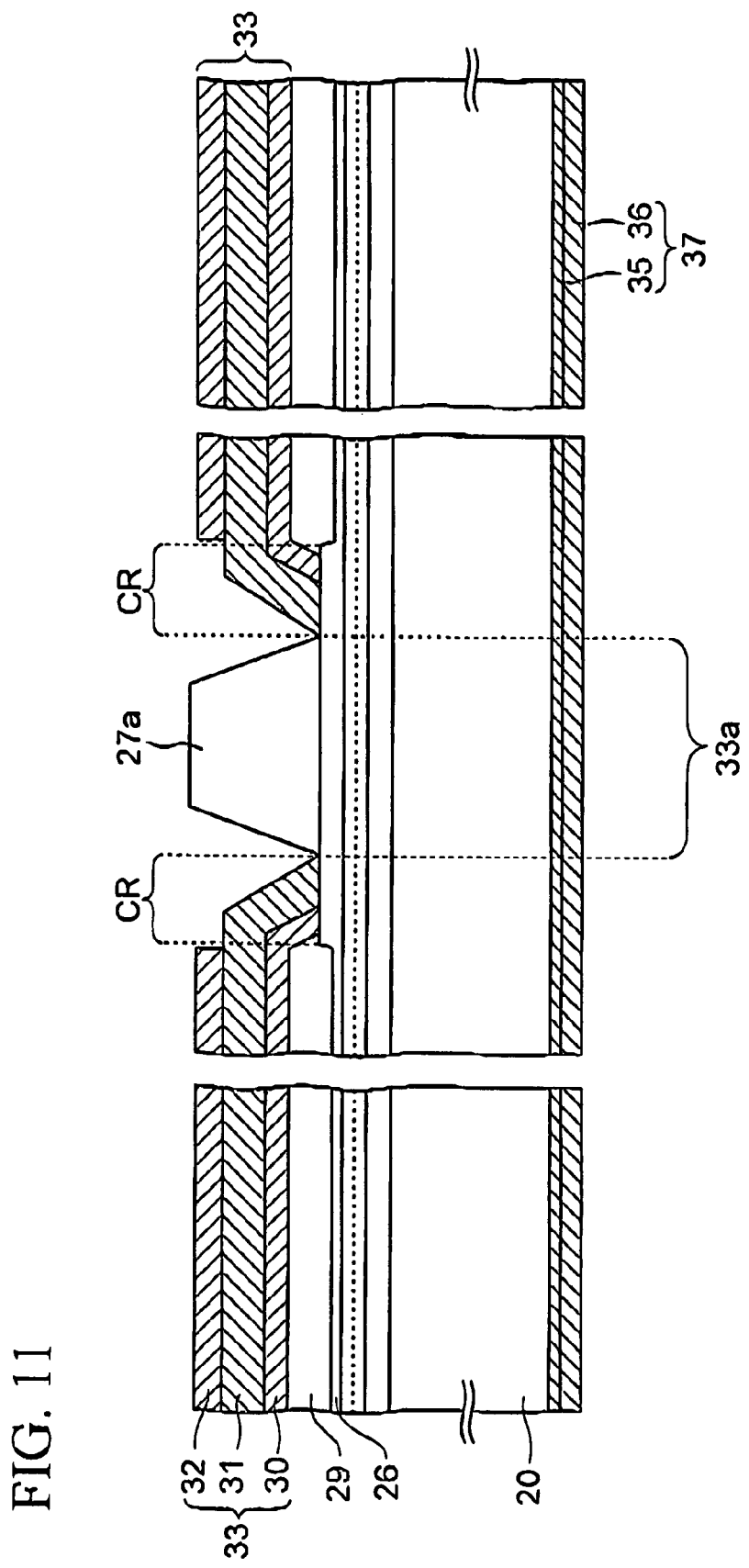
FIG. 11 is a cross-sectional view taken along the line III-III of FIG. 8.

FIG. 11 is a cross-sectional view taken along the line III-III of FIG. 8. In FIG. 11, the length of a cross section is shown larger than that of a cross section of FIG. 7.

Figure 12:
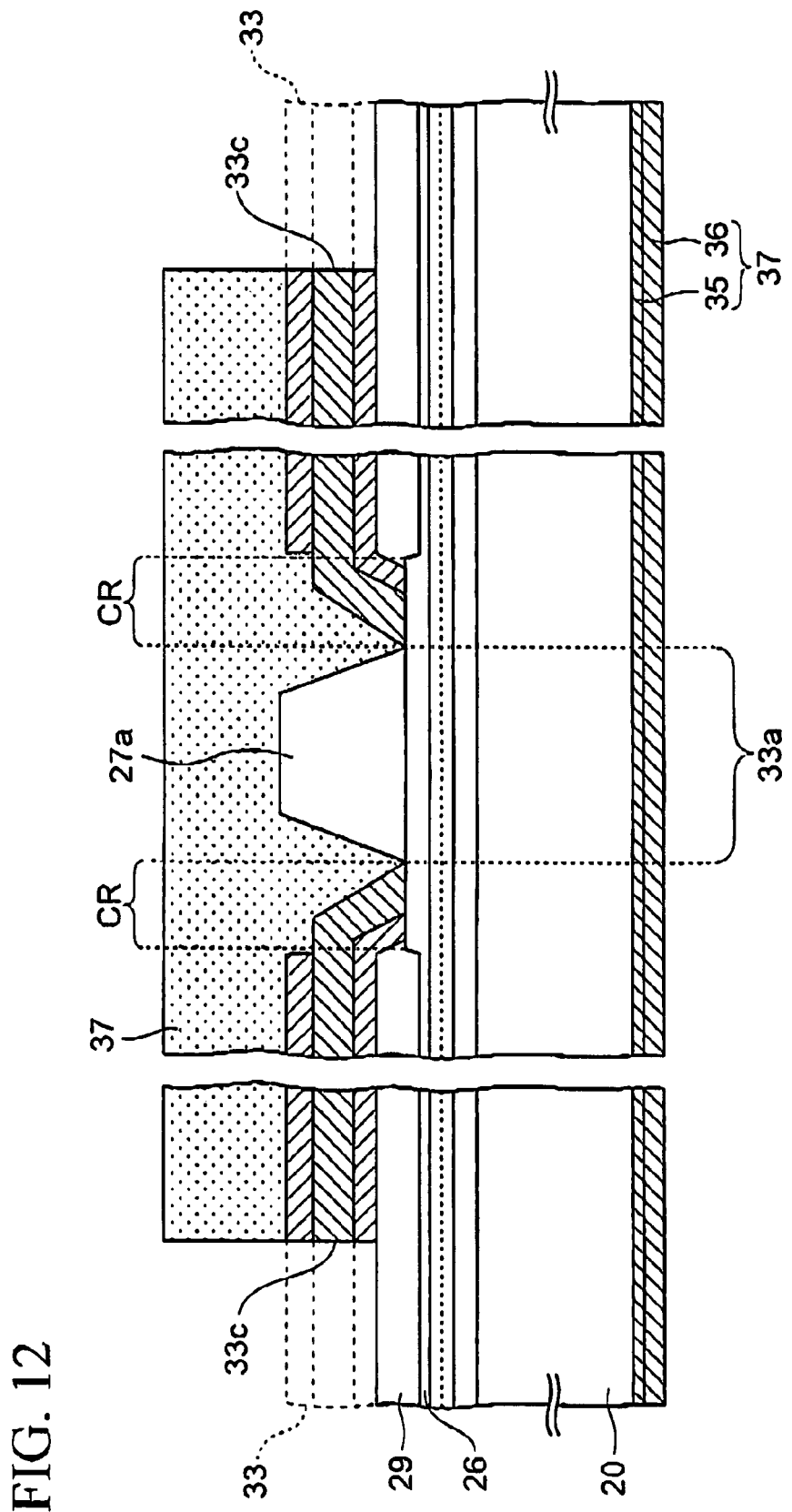
FIG. 12 is a cross-sectional view taken along the line IV-IV of FIG. 9.

Then, as shown in FIG. 12, a photoresist is coated on the entire surface of the metal multilayer film 33, and the photoresist is exposed by an optical exposure system such as a stepper, and thereafter the photoresist is developed to form a resist pattern 37 covering the second opening 33a. Thereafter, the metal multilayer film 33 is etched, while using the resist pattern 37 as a mask, by means of RIE using Ar (argon) as etching gas for the gold layer 32 and the platinum 31, and using $CF_4$ as etching gas for the titanium layer 30. Thereby, the metal multilayer film 33 left under the resist pattern 37 is made into a p-side electrode layer (first electrode layer) 33c.

FIG. 9 is a plan view in this process. FIG. 12 corresponds to a cross-sectional view taken along the line IV-IV of FIG. 9. As shown in FIG. 9, the resist pattern 37 covers the all of the plural second openings 33a and the test opening 33b.

Thereafter, the resist pattern 37 is removed, and thereby a basic structure of the optical semiconductor device, as shown in FIG. 10, is completed.

Figure 13:
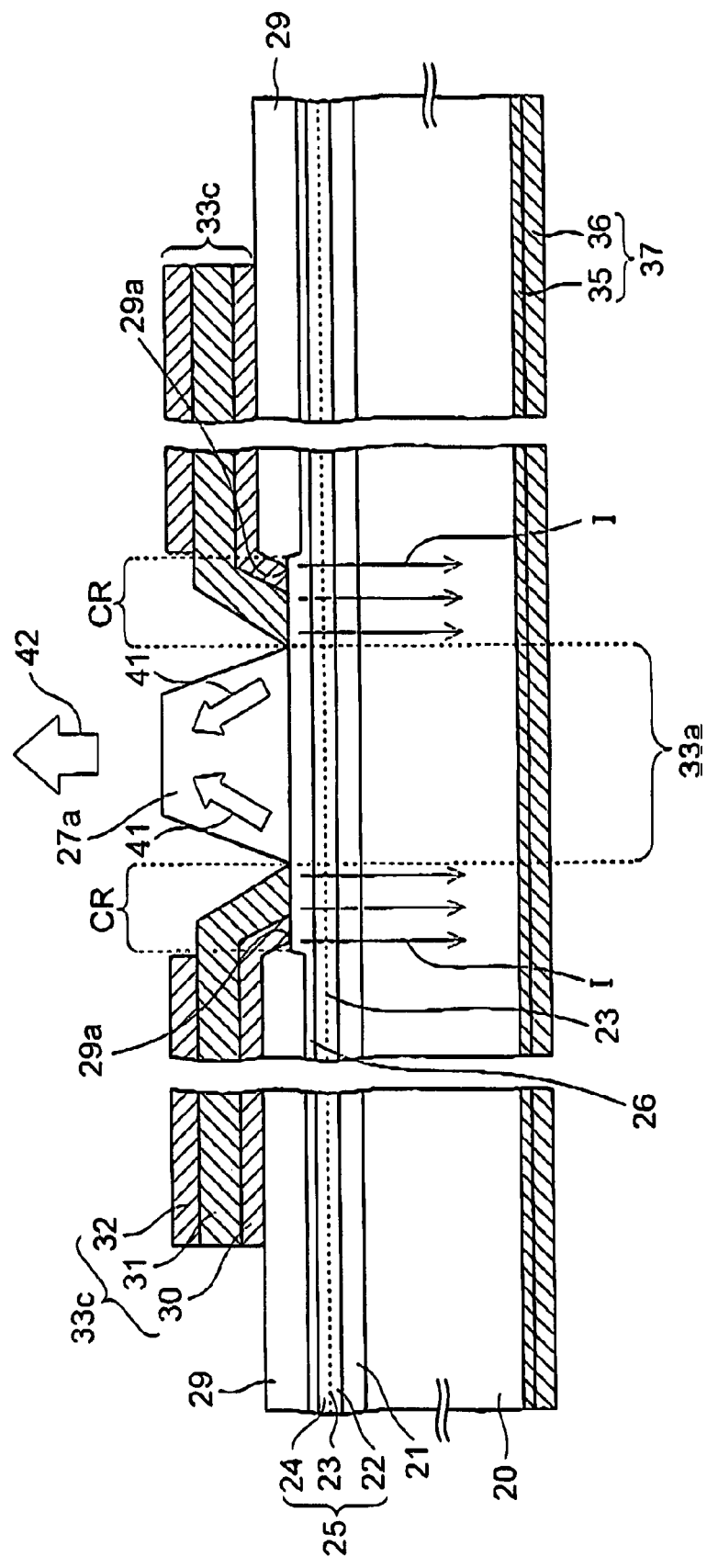
FIG. 13 is a cross-sectional view taken along the line V-V of FIG. 10.

FIG. 13 is a cross-sectional view taken along the line V-V of FIG. 10.

In this optical semiconductor device, when a current I is injected into the quantum dot 23 from the p-side electrode layer 33c, a single photon 41 created by recombination of carriers is generated in the quantum dot 23, and the single photon is taken out as output light 42 through the hard mask (optical window) 27a.

Moreover, in this optical semiconductor device, the width of the contact region CR where the p-side electrode layer 33c is in ohmic contact with the p-type contact layer 26 lies between 10 and 500 nm inclusive, which is further smaller than the receding amount d of the hard mask 27a shown in FIG. 5(a). This shows that the contact region CR is very narrow, as compared to the contact region of 10 μm in width described in Non-patent Document 1. Thus, the current I supplied to the quantum dot 23 from the p-side electrode layer 33c is limited in amount by the narrow contact region CR, so that an excessive current is not supplied to the quantum dot 23. This makes it possible to suppress an increase in power consumption incident to an unnecessary amount of current, and also to prevent the wavelength of the output light 42 from being shifted than its designed value due to the heated quantum dot 23 by the large current.

Moreover, parasitic capacitance C (see FIG. 7) between the p-side electrode layer 33c and the GaAs substrate (semiconductor substrate) 20 is smaller than the conventional structure, since the width of the contact region CR is narrow as mentioned above. Therefore, even when the frequency of a signal voltage to the electrode layers 33c and 37 is increased, a single-photon generator suitable for high frequencies can be achieved because the signal delay due to the parasitic capacitance C is reduced.

Moreover, the first opening 29a (see FIG. 13) that defines the contact region CR of narrow width is self-aligned with the hard mask 27a without using photolithography. Thus, the width of the contact region CR becomes uniform around the hard mask 27a, so that the contact area of the p-side electrode layer 33c being in contact with the p-type contact layer 26 is also uniform around the hard mask 27a. As a result, the current density of the current I supplied from the p-side electrode layer 33c to the active layer 25 can be made uniform around the hard mask 27a.

Moreover, since the first opening 29a is formed in self-aligned manner with the hard mask 27a in this manner, it is made possible to simplify the processes than the case where photolithography or EB lithography for formation of the first opening 29a is used. Hence, the single-photon generator can be manufactured by an easy manufacturing process adapted for mass production.

As described with reference to FIG. 4(a), the hard mask 27a is formed by means of etching using the resist 28 as the mask. The resist 28 can be formed by using the optical exposure system such as the stepper to expose the photoresist, without using the low-throughput EB exposure system for exposure of the photoresist. Thus, the present embodiment can reduce manufacturing costs for the single-photon generator and thus provide a high-quality single-photon generator at low cost, as compared to the use of the EB exposure system that raises the manufacturing costs due to its low throughput.

Further, as shown in FIG. 13, the hard mask (optical window) 27a functions as a lens to focus not only the single photon 41 generated in the quantum dot 23 inside the second opening 33a but also the single photon 41 generated in the quantum dot 23 outside the second opening 33a into the output light 42. This makes it possible to increase the intensity of the output light 42, as compared to the case where the hard mask (optical window) 27a is not formed.

Moreover, the hard mask (optical window) 27a has the anti-reflection function of preventing light reflection between the p-type contact layer 26 and outside air. This prevents the single photon 41 from reflecting on the upper surface of the p-type contact layer 26 and hence reduces light traveling back to the quantum dot 23, thus making it possible to take out most of the generated single photon 41 as the output light 42 and hence increase the intensity of the output light 42.

Moreover, after completing the formation of the hard mask 27a (see FIG. 4(a)), the active layer 25 including the quantum dot 23 is always covered with the hard mask 27a, so that the active layer 25 is protected by the hard mask 27a from process damage during etching or vapor deposition. This reduces the likelihood of defects appearing in the active layer 25 due to the process damage, thus making it possible to prevent the single photon 41 from having insufficient intensity due to the defects.

Furthermore, in the embodiment, the thickness of the p-type contact layer 26 outside the first opening 29a is made smaller than that of the p-type contact layer 26 inside the first opening 29a. Thereby, the thin p-type contact layer 26 outside the first opening 29a functions to narrow the current I into the first opening 29a. This enables the efficient injection of the current I into the contact region CR within the first opening 29a, thus making it possible to enhance luminous efficiency in the contact region CR.

Incidentally, the efficiency of the single photon taken out through the second opening 33a depends on the diameter $D_2$ of the second opening 33a (see FIG. 6(b)), as well as the amount of the current I. The diameter $D_2$, by which the photon can be taken out with efficiency at a wavelength of 1300 nm for example, lies between about 500 nm and 10 μm, both inclusive.

As described above, the embodiment can provide the optical semiconductor device having superior performance capabilities in a bit rate, a transmission distance and security for quantum cryptographic technology.

The invention claimed is:

1. An optical semiconductor device comprising:
a semiconductor substrate;
a doping layer formed on one surface of the semiconductor substrate;
an active layer formed on the doping layer and including at least a quantum dot;
a contact layer formed on the active layer and being of an opposite conduction type to the doping layer;
an insulating layer formed on the contact layer and having a first opening whose size is such that a contact region of the contact layer is included in the first opening;
a first electrode layer formed on the contact region of the contact layer and on the insulating layer, and having a second opening included in the first opening; and
a second electrode layer formed on the other surface of the semiconductor substrate.

2. The optical semiconductor device according to claim 1, wherein the contact layer outside the first opening is thinner than the contact layer inside the first opening.

3. The optical semiconductor device according to claim 1, wherein an optical window is formed on the contact layer in the second opening.

4. The optical semiconductor device according to claim 3, wherein the optical window is made of silicon oxide.

5. The optical semiconductor device according to claim 3, wherein the optical window is of mesa shape in cross section.

6. The optical semiconductor device according to claim 3, wherein the second opening is formed in contact with the optical window.

7. The optical semiconductor device according to claim 1, wherein the first electrode layer is a multilayer film made by forming a titanium layer, a platinum layer, and a gold layer in this order.

8. The optical semiconductor device according to claim 1, wherein the respective edges of the first and second openings are spaced at a distance of 10 to 500 nm inclusive away from each other.

9. The optical semiconductor device according to claim 1, wherein the quantum dot is made of InAs.

10. The optical semiconductor device according to claim 1, wherein the doping layer is made of n-type AlGaAs, and the contact layer is made of p-type GaAs.

11. The optical semiconductor device according to claim 1, wherein the quantum dot generates a single photon.

12. A method of manufacturing an optical semiconductor device, comprising:
forming a doping layer, an active layer including at least a quantum dot, and a contact layer of an opposite conduction type to the doping layer on one surface of a semiconductor substrate in this order;
forming a mask layer on the contact layer;
forming a resist in island shape on the mask layer;
making the mask layer into a hard mask by etching the mask layer using the resist as a mask;
receding a side surface of the hard mask to expose a contact region of the contact layer and to make the resist overhang beyond the upper surface of the hard mask;
forming an insulating layer on the resist and on the contact layer outside the contact region;
forming a conductive layer on the insulating layer and on the contact layer within the contact region;
lifting-off the insulating layer and the conductive layer on the resist by removing the resist, so that the insulating layer, which has a first opening whose size is such that the contact region is included in the first opening, is left on the doping layer, and the conductive layer, which has a second opening whose size is such that the second opening is included in the first opening, is left on the doping layer as a first electrode layer; and
forming a second electrode layer on the other surface of the semiconductor substrate.

13. The method of manufacturing an optical semiconductor device according to claim 12, further comprising:
after forming the hard mask, etching the contact layer partially in its thickness while using the hard mask as an etching mask.

14. The method of manufacturing an optical semiconductor device according to claim 13, wherein the etching of the contact layer partially is carried out by etching the contact layer by use of an etchant containing $NH_4OH$.

15. The method of manufacturing an optical semiconductor device according to claim 12, wherein the formation of the first electrode layer is carried out by employing vapor deposition method in which the perpendicular direction of the upper surface of the semiconductor substrate is tilted from the vertical direction, and thus leading a vaporized element of the first electrode layer to the contact region under the overhung resist.

16. The method of manufacturing an optical semiconductor device according to claim 12, further comprising:
before forming the conductive layer, removing the insulating layer formed on the contact region.

17. The method of manufacturing an optical semiconductor device according to claim 12, wherein an optically transparent layer is used as the mask layer, and after the lifting-off, the hard mask is used as an optical window.

18. The method of manufacturing an optical semiconductor device according to claim 12, wherein the etching of the mask layer is carried out by subjecting the mask layer to wet etching firstly, and then subjecting the mask layer to dry etching.

19. The method of manufacturing an optical semiconductor device according to claim 12, wherein the receding of the side surface of the hard mask is carried out by subjecting the side surface of the hard mask to wet etching.

20. The method of manufacturing an optical semiconductor device according to claim 19, wherein the formation of the resist is carried out by forming a photoresist on the mask layer, exposing the photoresist by an optical exposure system, and developing the photoresist.

* * * * *